(12) United States Patent
Itou et al.

(10) Patent No.: US 8,604,554 B2
(45) Date of Patent: Dec. 10, 2013

(54) SEMICONDUCTOR DEVICE

(75) Inventors: Satoru Itou, Hyogo (JP); Hiromasa Fujimoto, Toyama (JP); Susumu Akamatsu, Osaka (JP); Toshie Kutsunai, Osaka (JP)

(73) Assignee: Panasonic Corporation, Osaka (JP)

( * ) Notice: Subject to any disclaimer, the term of this patent is extended or adjusted under 35 U.S.C. 154(b) by 160 days.

(21) Appl. No.: 13/399,102

(22) Filed: Feb. 17, 2012

(65) Prior Publication Data
US 2012/0146154 A1   Jun. 14, 2012

Related U.S. Application Data

(63) Continuation of application No. PCT/JP2010/000958, filed on Feb. 16, 2010.

(30) Foreign Application Priority Data

Oct. 23, 2009   (JP) .................................. 2009-244632

(51) Int. Cl.
*H01L 21/70*   (2006.01)

(52) U.S. Cl.
USPC .................... 257/369; 257/E27.062; 257/368

(58) Field of Classification Search
USPC .................................. 257/369, 368, E27.062
See application file for complete search history.

(56) References Cited

U.S. PATENT DOCUMENTS

| | | | |
|---|---|---|---|
| 7,064,396 B2 * | 6/2006 | Chen et al. ..................... | 257/369 |
| 2006/0151776 A1 | 7/2006 | Hatada et al. | |
| 2006/0163624 A1 * | 7/2006 | Kuroi ............................. | 257/288 |
| 2007/0126063 A1 * | 6/2007 | Aoyama ........................ | 257/369 |
| 2009/0020822 A1 | 1/2009 | Nakanishi et al. | |
| 2009/0065807 A1 | 3/2009 | Fujimoto | |
| 2009/0085123 A1 | 4/2009 | Sato | |
| 2009/0095982 A1 | 4/2009 | Kim | |

FOREIGN PATENT DOCUMENTS

| | | |
|---|---|---|
| JP | 2006-196549 | 7/2006 |
| JP | 2009-88069 | 4/2009 |
| JP | 2009-094225 | 4/2009 |

(Continued)

OTHER PUBLICATIONS

International Search Report of PCT Application No. PCT/JP2010/000958 dated May 25, 2010.
T.Ghani et al., "A 90nm High Volume Manufacturing Logic Technology Featuring Novel 45nm Gate Length Strained Silicon CMOS Transistors", Electron Devices Meeting, 2003. IEDM Tech. Digest, pp. 978-980, Dec. 2003.

(Continued)

*Primary Examiner* — Timor Karimy
(74) *Attorney, Agent, or Firm* — McDermott Will & Emery LLP

(57) ABSTRACT

A semiconductor device includes a first and a second MIS transistor. The first and second MIS transistors include a first and a second gate electrode formed on a first and a second active region with a first and a second gate insulating film being formed therebetween, first and second sidewalls including a first and a second inner sidewall formed on side surfaces of the first and second gate electrodes and having an L-shaped cross-section, and first and second source/drain regions formed in the first and second active regions laterally outside the first and second sidewalls. The first source/drain regions include a silicon compound layer formed in trenches provided in the first active region and causes a first stress in a gate length direction of a channel region in the first active region. A width of the first inner sidewall is smaller than a width of the second inner sidewall.

15 Claims, 9 Drawing Sheets

(56) References Cited

FOREIGN PATENT DOCUMENTS

| JP | 2009-94225 | 4/2009 |
| JP | 2009-147138 | 7/2009 |
| JP | 2009-164200 | 7/2009 |
| JP | 2009-200225 | 9/2009 |

OTHER PUBLICATIONS

Z. Luo et al., "Design of High Performance PFETs with Strained Si Channel and Laser Anneal", Electron Devices Meeting, 2005. IEDM Tech. Digest, pp. 495-498, Dec. 2005.

* cited by examiner

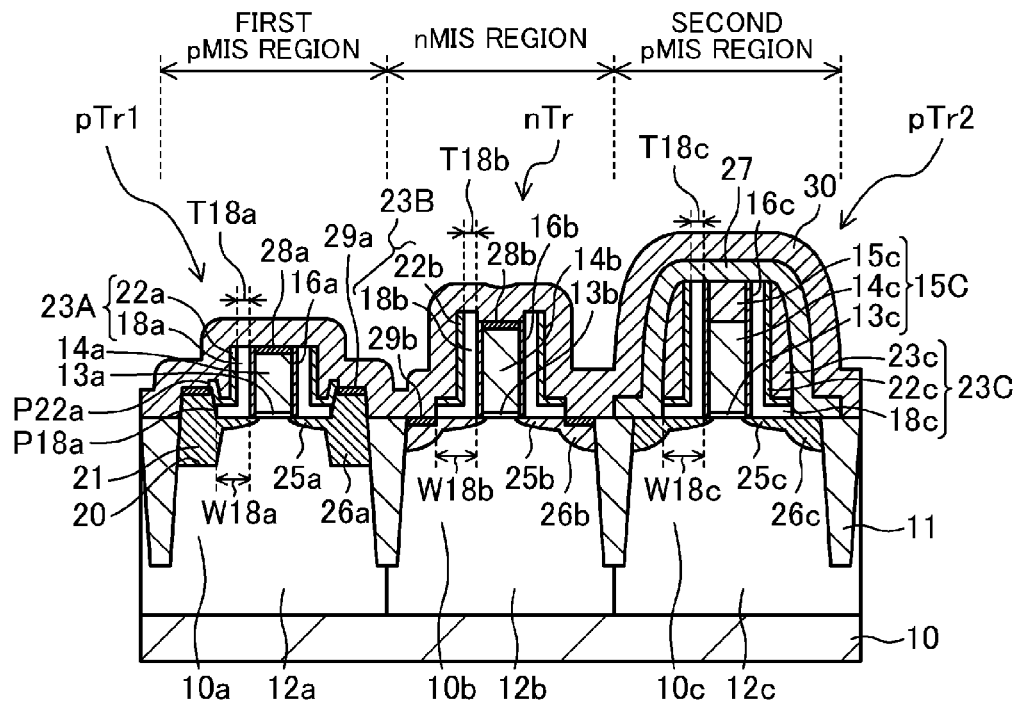

US 8,604,554 B2

SEMICONDUCTOR DEVICE

CROSS-REFERENCE TO RELATED APPLICATIONS

This is a continuation of PCT International Application PCT/JP2010/000958 filed on Feb. 16, 2010, which claims priority to Japanese Patent Application No. 2009-244632 filed on Oct. 23, 2009. The disclosures of these applications including the specifications, the drawings, and the claims are hereby incorporated by reference in their entirety.

BACKGROUND

The present disclosure relates to semiconductor devices and methods for manufacturing semiconductor devices, and more particularly, to semiconductor devices including a metal-insulator-semiconductor field-effect transistor (MISFET) having source/drain regions including a silicon compound layer, and methods for fabricating the semiconductor devices.

A technique of enhancing the drive capability of a MISFET (hereinafter referred to as a "MIS transistor") by applying a stress to the channel region of the MIS transistor has been employed so as to improve the performance of a semiconductor integrated circuit device. For p-type MIS transistors, it is known that if a compressive stress is applied to the channel region in the gate length direction, the mobility of carriers is increased, whereby the drive capability of the p-type MIS transistor is enhanced. For example, a compressive stress may be applied to the channel region in the gate length direction by forming, in the source/drain regions, a SiGe layer having a larger lattice constant than that of the silicon substrate (see, for example, PATENT DOCUMENT 1: Japanese Patent Publication No. 2006-196549, NON-PATENT DOCUMENT 1: T. Ghani et al., "A 90 nm High Volume Manufacturing Logic Technology Featuring Novel 45 nm Gate Length Strained Silicon CMOS Transistors," IEDM Tech. Digest, pp. 978-980, 2003, and NON-PATENT DOCUMENT 2: Z. Luo et al., "Design of High Performance PFETs with Strained Si Channel and Laser Anneal," IEDM Tech. Digest, pp. 495-498, 2005).

A method for fabricating a conventional semiconductor device including a p-type MIS transistor having p-type source/drain regions including a SiGe layer and an n-type MIS transistor will be described hereinafter with reference to FIGS. 8A-8C, 9A-9C, and 10A-10C. FIGS. 8A-10C are cross-sectional views showing the conventional semiconductor device as viewed in the gate length direction, in the order in which the semiconductor device is fabricated. In FIGS. 8A-10C, the term "pMIS region" shown on the left side refers to a region where the p-type MIS transistor is formed, and the term "nMIS region" shown on the right side refers to a region where the n-type MIS transistor is formed.

Initially, as shown in FIG. 8A, an isolation region 101 is selectively formed in an upper portion of a semiconductor substrate 100. As a result, a first active region 100a surrounded by the isolation region 101 is formed in the pMIS region of the semiconductor substrate 100. A second active region 100b surrounded by the isolation region 101 is formed in the nMIS region of the semiconductor substrate 100. Thereafter, an n-type well region 102a is formed in the pMIS region of the semiconductor substrate 100. On the other hand, a p-type well region 102b is formed in the nMIS region of the semiconductor substrate 100.

Next, on the first and second active regions 100a and 100b, a first and a second gate electrode formation portion 105A and 105B are formed which include a first and a second gate insulating film 103a and 103b, a first and a second gate electrode 104a and 104b, and a first and a second protective insulating film 105a and 105b made of a silicon oxide film.

Next, first and second offset spacers 106a and 106b made of a silicon oxide film are formed on side surfaces of the first and second gate electrode formation portions 105A and 105B. Thereafter, p-type and n-type extension injection regions 107a and 107b are formed in the first and second active regions 100a and 100b laterally outside the first and second gate electrode formation portions 105A and 105B (i.e., are formed in the first and second active regions 100a and 100b adjacent to the channel region and extending laterally away from it).

Next, as shown in FIG. 8B, first and second sidewalls 109A and 109B including first and second inner sidewalls 108a and 108b made of a silicon oxide film, and first and second outer sidewalls 109a and 109b made of a silicon nitride film, are formed on side surfaces of the first and second gate electrode formation portions 105A and 105B, with the first and second offset spacers 106a and 106b being interposed between the first and second inner sidewalls 108a and 108b and the side surfaces of the first and second gate electrode formation portions 105A and 105B.

Next, as shown in FIG. 8C, an insulating film 110 made of a silicon oxide film is formed on an entire surface of the semiconductor substrate 100.

Next, as shown in FIG. 9A, a resist pattern (not shown) which exposes the pMIS region and covers the nMIS region is formed on the insulating film 110 by a lithography process. Thereafter, the insulating film 110 is etched by dry etching using the resist pattern as a mask. As a result, a surface of the first active region 100a is exposed. On the other hand, the insulating film 110 which covers the second gate electrode formation portion 105B and the first sidewalls 109B is left on the second active region 100b. In this case, unnecessary sidewalls 110a are left on side surfaces of the first sidewalls 109A. Thereafter, the resist pattern is removed.

Next, as shown in FIG. 9B, the first active region 100a is etched using the sidewalls 110a and the insulating film 110 as a mask. As a result, trenches 111 are formed in the first active region 100a laterally outside the sidewalls 110a.

Next, as shown in FIG. 9C, a SiGe layer 112 doped with a p-type impurity is formed in the trenches 111. Because the SiGe layer 112 is doped with the p-type impurity, the regions of the SiGe layer 112 are p-type impurity-introduced regions.

Next, as shown in FIG. 10A, the first and second protective insulating films 105a and 105b (silicon oxide film), the sidewalls 110a (silicon oxide film), and the insulating film 110 (silicon oxide film) are removed. As a result, upper surfaces of the first and second gate electrodes 104a and 104b, and the first and second sidewalls 109A and 109B, are exposed.

Next, as shown in FIG. 10B, n-type source/drain implanted regions 113 are formed in the second active region 100b laterally outside the second sidewalls 109B.

Next, as shown in FIG. 10C, a thermal treatment is performed. As a result, the p-type impurity contained in the p-type extension injection regions 107a is activated to form p-type extension regions 114a. The n-type impurity contained in the n-type extension injection regions 107b is activated to form n-type extension regions 114b. The p-type impurity contained in the regions (p-type impurity-introduced regions) of the SiGe layer 112 is activated to form p-type source/drain regions 115a. The n-type impurity contained in the n-type source/drain implanted regions 113 is activated to form n-type source/drain regions 115b.

Thereafter, although not shown, a first and a second silicide layer are formed on the first and second gate electrodes 104a and 104b, and a third and a fourth silicide layer are formed on the p-type and n-type source/drain regions 115a and 115b.

Thus, the conventional semiconductor device is fabricated.

SUMMARY

However, the conventional semiconductor device has the following problems.

When a compressive stress is applied to the channel region of the p-type MIS transistor in the gate length direction, the drive capability of the p-type MIS transistor is enhanced. In contrast to this, when a compressive stress is applied to the channel region of the n-type MIS transistor in the gate length direction, the drive capability of the n-type MIS transistor is degraded. Therefore, for a semiconductor device including a p-type and an n-type MIS transistor on the same semiconductor substrate, it is necessary that while a SiGe layer be formed in the source/drain regions of the p-type MIS transistor, a SiGe layer not be formed in the source/drain regions of the n-type MIS transistor.

Therefore, in the conventional semiconductor device, a SiGe layer is prevented from being formed in the n-type source/drain regions as follows. As shown in FIG. 8C, the insulating film 110 is formed an entire surface of the semiconductor substrate 100. Thereafter, as shown in FIG. 9A, a portion of the insulating film 110 which has been formed in the pMIS region is etched. As a result, a surface of the first active region 100a is exposed. On the other hand, the insulating film 110 is left on the second active region 100b. The remaining insulating film 110 prevents the formation of trenches in the second active region 100b laterally outside the second sidewalls 109B, i.e., the formation of a SiGe layer in the trenches (i.e., a SiGe layer is prevented from being formed in the n-type source/drain regions 115b).

However, as shown in FIG. 9A, when a portion of the insulating film 110 which has been formed in the pMIS region is etched, not all the portion is removed, so that unnecessary sidewalls 110a are left on the side surfaces of the first sidewalls 109A. Therefore, as shown in FIG. 9B, the trenches 111 are formed in the first active region 100a laterally outsides the sidewalls 110a, but not laterally outsides the first sidewalls 109A. Therefore, as shown in FIG. 9C, the SiGe layer 112 is formed in the first active region 100a laterally outsides the sidewalls 110a. Therefore, the SiGe layer 112 cannot be formed in the first active region 100a close to the channel region, so that a compressive stress caused by the SiGe layer 112 cannot be effectively applied to the channel region of the first active region 100a in the gate length direction.

The present disclosure describes implementations of a semiconductor device including a first MIS transistor having source/drain regions including a silicon compound layer, and a second MIS transistor, in which the silicon compound layer can be formed closer to the channel region of the first MIS transistor.

A semiconductor device according to a first aspect of the present disclosure includes a first MIS transistor and a second MIS transistor. The first MIS transistor includes a first gate insulating film formed on a first active region in a semiconductor substrate, a first gate electrode formed on the first gate insulating film, first sidewalls each including a first inner sidewall formed on a side surface of the first gate electrode and having an L-shaped cross-section, and first source/drain regions of a first conductivity type formed in the first active region laterally outside the first sidewalls. The second MIS transistor includes a second gate insulating film formed on a second active region in the semiconductor substrate, a second gate electrode formed on the second gate insulating film, second sidewalls each including a second inner sidewall formed on a side surface of the second gate electrode and having an L-shaped cross-section, and second source/drain regions of a second conductivity type formed in the second active region laterally outside the second sidewalls. The first source/drain regions include a silicon compound layer which is formed in trenches provided in the first active region and causes a first stress in a gate length direction of a channel region in the first active region. A width of the first inner sidewall is smaller than a width of the second inner sidewall.

According to the semiconductor device of the first aspect of the present disclosure, the silicon compound layer is formed using the first inner sidewall having a smaller width than that of the second inner sidewall. Therefore, the silicon compound layer can be formed in the first active region closer to the channel region. Therefore, the first stress can be effectively applied in the gate length direction of the channel region in the first active region, whereby the drive capability of the first MIS transistor can be effectively enhanced.

In addition, the second source/drain region is formed using the second inner sidewall having a larger width than that of the first inner sidewall. Therefore, the second source/drain region can be formed in the second active region further away from the channel region, whereby an increase in leakage current can be reduced in the second MIS transistor.

In the semiconductor device of the first aspect of the present disclosure, a space between the first gate electrode and the silicon compound layer is preferably smaller than the width of the second inner sidewall.

The semiconductor device of the first aspect of the present disclosure preferably further includes a first silicide layer formed on the first gate electrode, and a second silicide layer formed on the second gate electrode. A height of an upper surface of the first silicide layer is preferably lower than a height of an upper surface of the second silicide layer.

The semiconductor device of the first aspect of the present disclosure preferably further includes first offset spacers each formed between the first gate electrode and a corresponding one of the first inner sidewalls and having an I-shaped cross-section, and second offset spacers each formed between the second gate electrode and a corresponding one of the second inner sidewalls and having an I-shaped cross-section.

In the semiconductor device of the first aspect of the present disclosure, a thickness of the first inner sidewall is preferably substantially the same as or smaller than a thickness of the second inner sidewall.

In the semiconductor device of the first aspect of the present disclosure, the first sidewalls each preferably further include a first middle sidewall which is formed on a corresponding one of the first inner sidewalls and has an L-shaped cross-section. The second sidewalls each preferably further include a second middle sidewall which is formed on a corresponding one of the second inner sidewalls and has an L-shaped cross-section. A lower tip of the first middle sidewall is preferably located further away from the first gate electrode than a lower tip of the first inner sidewall.

The semiconductor device of the first aspect of the present disclosure preferably further includes a first stress insulating film which is formed on the first active region to cover the first gate electrode and the first sidewalls, and causes a stress in the same direction as that of the first stress, in the gate length direction of the channel region in the first active region.

In the semiconductor device of the first aspect of the present disclosure, the first MIS transistor is preferably a p-type MIS transistor, and the first stress is preferably a compressive stress.

The semiconductor device of the first aspect of the present disclosure preferably further includes a second stress insulating film which is formed on the second active region to cover the second gate electrode and the second sidewalls and causes a second stress in a direction opposite to that of the first stress, in a gate length direction of a channel region in the second active region.

In the semiconductor device of the first aspect of the present disclosure, the second MIS transistor is preferably an n-type MIS transistor, and the second stress is preferably a tensile stress.

The semiconductor device of the first aspect of the present disclosure preferably further includes a third MIS transistor including a third gate insulating film formed on a third active region in the semiconductor substrate, a third gate electrode formed on the third gate insulating film, third sidewalls formed on side surfaces of the third gate electrode, and third source/drain regions of the first conductivity type formed in the third active region laterally outside the third sidewalls. The third sidewalls preferably include third inner sidewalls formed on the side surfaces of the third gate electrode and having an L-shaped cross-section, third middle sidewalls formed on the third inner sidewalls and having an L-shaped cross-section, and third outer sidewalls formed on the third middle sidewalls. The first sidewall and the second sidewall preferably do not have an outer sidewall. A silicon compound layer is preferably not formed in the third source/drain regions. A width of the third inner sidewall is preferably larger than the width of the first inner sidewall.

Thus, the third source/drain region is formed using the third inner sidewall having a larger width than that of the first inner sidewall. Therefore, the third source/drain region can be formed in the third active region further away from the channel region, whereby an increase in leakage current can be reduced in the third MIS transistor.

The semiconductor device of the first aspect of the present disclosure preferably further includes a protective insulating film formed on the third gate electrode. A silicide layer is preferably not formed on the third gate electrode.

A semiconductor device according to a second aspect of the present disclosure includes a first MIS transistor and a third MIS transistor. The first MIS transistor includes a first gate insulating film formed on a first active region in a semiconductor substrate, a first gate electrode formed on the first gate insulating film, first sidewalls each including a first inner sidewall formed on a side surface of the first gate electrode and having an L-shaped cross-section and first middle sidewalls formed on the first inner sidewalls and having an L-shaped cross-section, first source/drain regions of a first conductivity type formed in the first active region laterally outside the first sidewalls, and a silicide layer formed on the first gate electrode. The third MIS transistor includes a third gate insulating film formed on a third active region in the semiconductor substrate, a third gate electrode formed on the third gate insulating film, third sidewalls each including a third inner sidewall formed on a side surface of the third gate electrode and having an L-shaped cross-section, a third middle sidewall formed on the third inner sidewall and having an L-shaped cross-section, and a third outer sidewall formed on the third middle sidewall, third source/drain regions of a first conductivity type formed in the third active region laterally outside the third sidewalls. The first source/drain regions include a silicon compound layer which is formed in trenches provided in the first active region and causes a first stress in a gate length direction of a channel region in the first active region. A silicon compound layer is not formed in the third source/drain regions. A width of the first inner sidewall is smaller than a width of the third inner sidewall.

According to the semiconductor device of the second aspect of the present disclosure, the silicon compound layer is formed using the first inner sidewall having a smaller width than that of the third inner sidewall. Therefore, the silicon compound layer can be formed in the first active region closer to the channel region. Therefore, the first stress can be effectively applied in the gate length direction of the channel region in the first active region, whereby the drive capability of the first MIS transistor can be effectively enhanced.

In addition, the third source/drain region is formed using the third inner sidewall having a larger width than that of the first inner sidewall. Therefore, the third source/drain region can be formed in the third active region further away from the channel region, whereby an increase in leakage current can be reduced in the third MIS transistor.

A method for fabricating a semiconductor device including a first MIS transistor formed on a first active region in a semiconductor substrate and a second MIS transistor formed on a second active region in the semiconductor substrate, according to an aspect of the present disclosure, includes the steps of (a) forming a first gate electrode formation portion including a first gate insulating film, a first gate electrode, and a first protective insulating film on the first active region, and a second gate electrode formation portion including a second gate insulating film, a second gate electrode, and a second protective insulating film on the second active region, (b) after step (a), forming first inner sidewalls made of a first insulating film on side surfaces of the first gate electrode formation portion and having an L-shaped cross-section, and protective sidewalls made of a second insulating film on the first inner sidewalls, and successively forming a first and a second insulating film on the second active region to cover the second gate electrode formation portion, (c) after step (b), forming trenches in the first active region laterally outside the protective sidewalls, and thereafter, forming, in the trenches, a silicon compound layer which causes a first stress in a gate length direction of a channel region in the first active region, and (d) after (c), removing the protective sidewalls and the first protective insulating film to expose the first inner sidewalls and an upper surface of the first gate electrode, and removing the second insulating film to expose the first insulating film.

According to the semiconductor device fabricating method of the aspect of the present disclosure, the first inner sidewall having a small width (e.g., a width smaller than that of the second inner sidewall), and the protective sidewall formed on the first inner sidewall, are formed. Thereafter, the trenches are formed in the first active region laterally outside the protective sidewalls using the protective sidewalls as a mask, and thereafter, the silicon compound layer is formed in the trenches. Therefore, the silicon compound layer can be formed in the first active region closer to the channel region. Therefore, the first stress can be effectively applied in the gate length direction of the channel region in the first active region, whereby the drive capability of the first MIS transistor can be effectively enhanced.

The semiconductor device fabricating method of the aspect of the present disclosure preferably further includes the steps of (e) after step (d), successively forming a third and a fourth insulating film on the semiconductor substrate, (f) etching the third and fourth insulating films on the first active region to form first sidewalls each including the first inner sidewall, a first middle sidewall made of the third insulating film formed on the first inner sidewall and having an L-shaped cross-section, and a first outer sidewall made of the fourth insulating film formed on the first middle sidewall, and etching the first, third, and fourth insulating films on the second active region to form second sidewalls each including a second inner sidewall made of the first insulating film formed on a side surface of the second gate electrode formation portion and having an L-shaped cross-section, a second middle sidewall made of the third insulating film formed on the second inner sidewall and having an L-shaped cross-section, and a second outer sidewall made of the fourth insulating film formed on the second middle sidewall, and (g) after step (f), forming first source/drain regions of a first conductivity type in the first active region in which the silicon compound layer has been formed, laterally outside the first sidewalls, and forming second source/drain regions of a second conductivity type in the second active region laterally outside the second sidewalls.

Thus, the second sidewall including the second inner sidewall having a larger width than that of the first inner sidewall is formed. Thereafter, the second source/drain regions are formed in the second active region laterally outside the second sidewalls using the second sidewalls as a mask. Therefore, the second source/drain region can be formed in the second active region further away from the channel region, whereby an increase in leakage current can be reduced in the second MIS transistor.

The semiconductor device fabricating method of the aspect of the present disclosure preferably further includes the steps of (h) after step (g), removing the first outer sidewalls to expose the first middle sidewalls, and removing the second outer sidewalls and the second protective insulating film to expose the second middle sidewalls and an upper surface of the second gate electrode, and (i) after step (h), forming a first silicide layer on the first gate electrode, and forming a second silicide layer on the second gate electrode.

The semiconductor device fabricating method of the aspect of the present disclosure preferably further includes the steps of (j) after step (i), forming, on the first active region, a first stress insulating film which causes a stress in the same direction as that of the first stress in the gate length direction of the channel region in the first active region, to cover the first gate electrode and the first sidewalls, and (k) after step (i), forming, on the second active region, a second stress insulating film which causes a stress in a direction opposite to the first stress in the gate length direction of a channel region in the second active region, to cover the second gate electrode and the second sidewalls.

According to the semiconductor device of the present disclosure and the method for fabricating the semiconductor device, the silicon compound layer can be formed in the first active region closer to the channel region. Therefore, the first stress can be effectively applied in the gate length direction of the channel region in the first active region, whereby the drive capability of the first MIS transistor can be effectively enhanced.

BRIEF DESCRIPTION OF THE DRAWINGS

FIG. 6 is a cross-sectional view showing a semiconductor device according to one embodiment of the present disclosure as viewed in the gate length direction.

FIG. 7 is a cross-sectional view showing a semiconductor device according to a variation of the embodiment of the present disclosure as viewed in the gate length direction.

DETAILED DESCRIPTION

A method for fabricating a semiconductor device according to one embodiment of the present disclosure will be described hereinafter with reference to FIGS. 1A-1C, 2A-2C, 3A-3C, 4A-4C, and 5A-5C. FIGS. 1A-5C are cross-sectional views showing the semiconductor device of the embodiment of the present disclosure as viewed in the gate length direction, in the order in which the semiconductor device is fabricated. In FIGS. 1A-5C, the term "first pMIS region" shown on the left side refers to a region where a first MIS transistor whose conductivity type is p-type is formed. The term "nMIS region" shown in the middle refers to a region where a second MIS transistor whose conductivity type is n-type is formed. The term "second pMIS region" shown on the right side refers to a region where a third MIS transistor whose conductivity type is p-type is formed. The term "first MIS transistor" refers to a MIS transistor having source/drain regions including a silicon compound layer. The first MIS transistor is used in, for example, a logic circuit or an internal circuit. The term "third MIS transistor" refers to a MIS transistor which does not include a silicide layer formed on source/drain regions. The third MIS transistor is used in, for example, an analog circuit or a peripheral circuit.

Figure 1A:
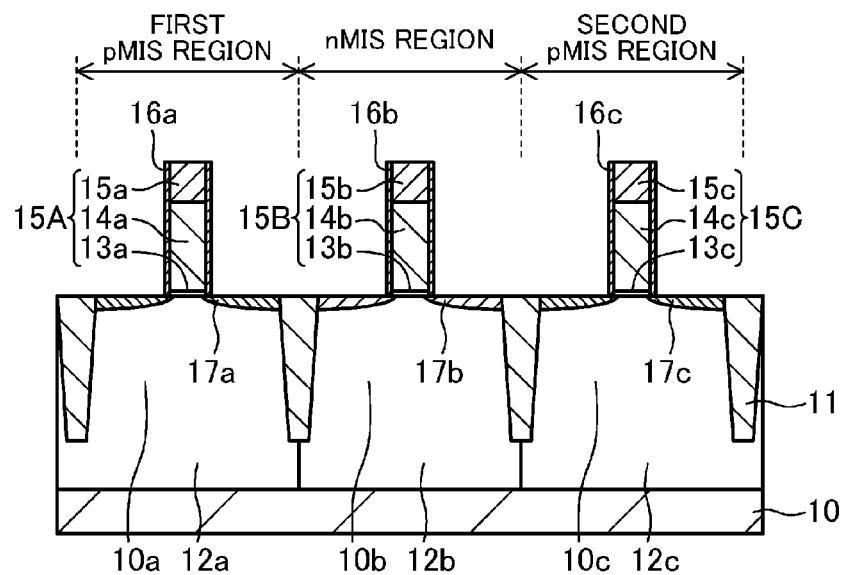
FIGS. 1A-1C are cross-sectional views showing a semiconductor device according to one embodiment of the present disclosure as viewed in the gate length direction, in the order in which the semiconductor device is fabricated.

Initially, as shown in FIG. 1A, an isolation region 11 is selectively formed in an upper portion of a semiconductor substrate 10 made of, for example, p-type silicon, by, for example, a shallow trench isolation (STI) process. As a result, a first and a third active region 10a and 10c surrounded by the isolation region 11 are formed in the first and second pMIS regions of the semiconductor substrate 10. A second active region 10b surrounded by the isolation region 11 is formed in the nMIS region of the semiconductor substrate 10.

Next, an n-type impurity, such as phosphorus (P) etc., is implanted into the first and second pMIS regions of the semiconductor substrate 10 by an ion implantation process. On the other hand, a p-type impurity, such as boron (B) etc., is implanted into the nMIS region of the semiconductor substrate 10 by an ion implantation process. Thereafter, a thermal treatment is performed. As a result, a first and a second n-type well region 12a and 12c are formed in the first and second pMIS regions of the semiconductor substrate 10. A p-type well region 12b is formed in the nMIS region of the semiconductor substrate 10.

Next, a gate insulating film formation film made of, for example, a silicon oxide film having a thickness of 1.5 nm is deposited on the semiconductor substrate 10 by, for example, a chemical vapor deposition (CVD) process. Thereafter, a gate electrode formation film made of, for example, a polysilicon film having a thickness of 50 nm is deposited on the gate insulating film formation film by, for example, a CVD process. Thereafter, a protective insulating film formation film made of, for example, a silicon nitride film having a thickness of 30 nm is deposited on the gate electrode formation film by, for example, a CVD process.

Next, a resist pattern (not shown) is formed on the protective insulating film formation film by a lithography process, and thereafter, the protective insulating film formation film, the gate electrode formation film, and the gate insulating film formation film are successively patterned by a dry etching process using the resist pattern as a mask. As a result, a first gate electrode formation portion 15A including a first gate insulating film 13a, a first gate electrode 14a, and a first protective insulating film 15a is formed on the first active region 10a. A second gate electrode formation portion 15B including a second gate insulating film 13b, a second gate electrode 14b, and a second protective insulating film 15b is formed on the second active region 10b. A third gate electrode formation portion 15C including a third gate insulating film 13c, a third gate electrode 14c, and a third protective insulating film 15c is formed on the third active region 10c.

Next, an offset spacer film made of, for example, a silicon nitride film having a thickness of 5 nm is deposited by, for example, a CVD process, and thereafter, the offset spacer film is subjected to anisotropic dry etching. As a result, first, second, and third offset spacers 16a, 16b, and 16c whose cross-sections have an I-shape are formed on side surfaces of the first, second, and third gate electrode formation portions 15A, 15B, and 15C. Thereafter, a p-type impurity, such as B etc., is implanted into the first and third active regions 10a and 10c by an ion implantation process using the first and third gate electrode formation portions 15A and 15C and the first and third offset spacers 16a and 16c as a mask. As a result, first and second p-type extension injection regions 17a and 17c are formed in a self-aligning manner in the first and third active regions 10a and 10c laterally outside the first and third gate electrode formation portions 15A and 15C. On the other hand, an n-type impurity, such as arsenide (As) etc., is implanted into the second active region 10b by an ion implantation process using the second gate electrode formation portion 15B and the second offset spacers 16b as a mask. As a result, n-type extension injection regions 17b are formed in a self-aligning manner in the second active region 10b laterally outside the second gate electrode formation portion 15B.

Figure 1B:
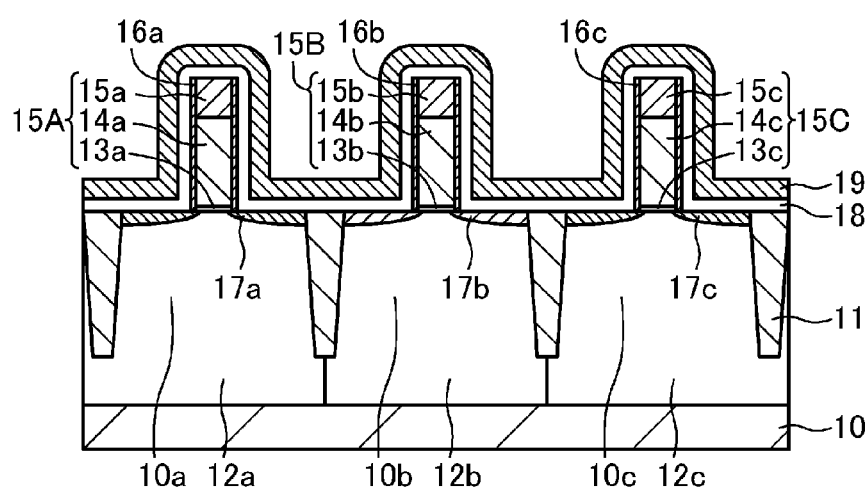

Next, as shown in FIG. 1B, a first insulating film 18 made of, for example, a silicon oxide film having a thickness of 5 nm is deposited on an entire surface of the semiconductor substrate 10 by, for example, a CVD process. Thereafter, a second insulating film 19 made of, for example, a silicon nitride film having a thickness of 15 nm is deposited on the first insulating film 18 by, for example, a CVD process.

Figure 1C:
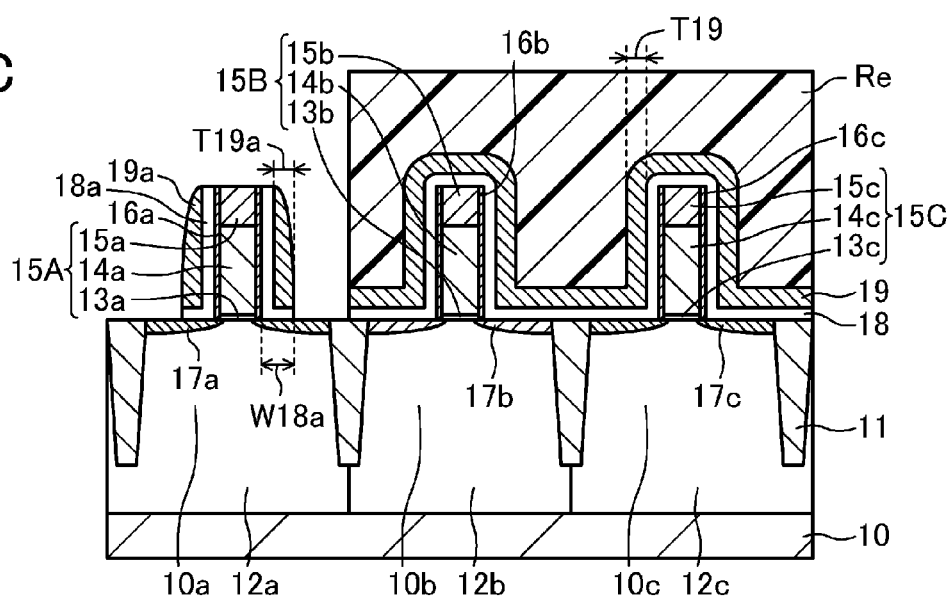

Next, as shown in FIG. 1C, a resist pattern Re which exposes the first pMIS region and covers the nMIS region and the second pMIS region is formed on the second insulating film 19 by a lithography process. Thereafter, the second insulating film 19 and the first insulating film 18 are successively subjected to anisotropic dry etching using the resist pattern Re as a mask. As a result, first inner sidewalls 18a which are made of the first insulating film and whose cross-sections have an L-shape are formed on side surfaces of the first gate electrode formation portion 15A with the first offset spacers 16a being interposed therebetween, and protective sidewalls 19a made of the second insulating film are formed on the first inner sidewalls 18a. On the other hand, a first and a second insulating film 18 and 19 which cover the second and third gate electrode formation portions 15B and 15C are left on the second and third active regions 10b and 10c.

In this case, the first inner sidewall 18a has a width W18a (largest width) of 20 nm (the sum of a thickness (5 nm) of the first insulating film 18 and a thickness (15 nm) of the second insulating film 19). By adjusting the thicknesses of the first and second insulating films 18 and 19, the width W18a of the first inner sidewall 18a can be adjusted. As used herein, the term "width" in relation to an inner sidewall whose cross-section has an L-shape (an inner sidewall having a first portion extending in a direction perpendicular to the main surface of the semiconductor substrate and a second portion extending in a direction parallel to the main surface of the semiconductor substrate) refers to a width (a width in a direction parallel to the main surface of the semiconductor substrate) of the second portion of the inner sidewall.

In this case, a thickness T19a of the protective sidewall 19a is the same as a thickness T19 of the second insulating film 19. Note that the thickness T19a of the protective sidewall 19a may be smaller than the thickness T19 of the second insulating film 19.

Figure 2A:
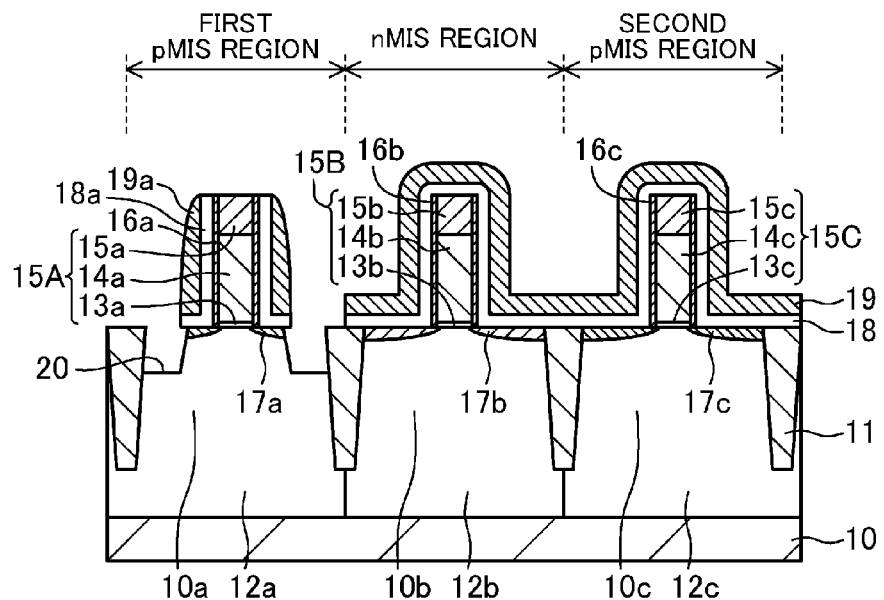
FIGS. 2A-2C are cross-sectional views showing the semiconductor device of the embodiment of the present disclosure as viewed in the gate length direction, in the order in which the semiconductor device is fabricated.

Next, as shown in FIG. 2A, the resist pattern Re is removed, and thereafter, the first active region 10a is subjected to, for example, dry etching using the protective sidewalls 19a and the second insulating film 19 as a mask. As a result, trenches 20 having a depth of, for example, 40 nm are formed in the first active region 10a laterally outside the protective sidewalls 19a.

Figure 2B:
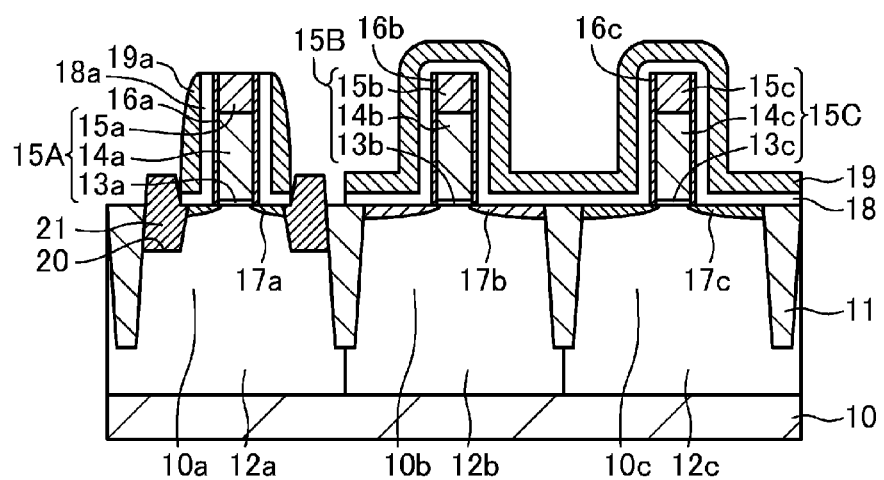

Next, as shown in FIG. 2B, for example, a silane gas ($SiH_4$ gas) and a germane gas ($GeH_4$ gas) are supplied along with a p-type impurity gas, such as a diborane gas ($B_2H_6$ gas) etc., by, for example, a CVD process. As a result, a silicon compound layer 21 made of, for example, silicon germanium (SiGe) having a thickness of 80 nm is formed in the trenches 20. The silicon compound layer 21 causes a compressive stress in the gate length direction of the channel region in the first active region 10a. Because the silicon compound layer 21 is doped with a p-type impurity, such as B etc., the regions of the silicon compound layer 21 are p-type impurity-introduced regions.

In this case, the first and second insulating films 18 and 19 are successively formed to cover surfaces of the second and third active regions 10b and 10c. Therefore, a silicon compound layer is not formed on the second and third active regions 10b and 10c.

In this case, an upper surface of the first gate electrode 14a is covered by the first protective insulating film 15a. Therefore, a silicon compound layer is not formed on the first gate electrode 14a. The second and third protective insulating films 15b and 15c and the first and second insulating films 18 and 19 are successively formed to cover upper surfaces of the second and third gate electrodes 14b and 14c. Therefore, a silicon compound layer is not formed on the second and third gate electrodes 14b and 14c.

As described above, by adjusting the thicknesses of the first and second insulating films 18 and 19, the width W18a of the first inner sidewall 18a can be adjusted. Therefore, if the width W18a of the first inner sidewall 18a is adjusted to be narrow (as described later, for example, the width W18a is adjusted to be narrower than the widths W18b and 18c of the second and third inner sidewalls 18b and 18c), as shown in FIG. 2A the trench 20 can be formed in the first active region 10a closer to the channel region, and as shown in FIG. 2B the silicon compound layer 21 can be formed in the first active region 10a closer to the channel region.

Figure 2C:
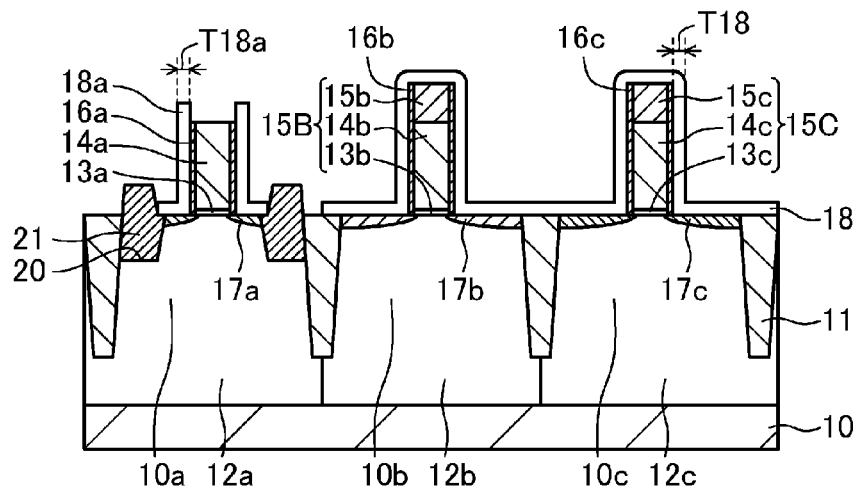

Next, as shown in FIG. 2C, the protective sidewalls 19a (silicon nitride film), the second insulating film 19 (silicon nitride film), and the first protective insulating film 15a (silicon nitride film) are removed by an etching process (e.g., a wet etching process using hot phosphoric acid of 160° C. as an etchant) having selectivity to a silicon oxide film (the first inner sidewalls 18a and the first insulating film 18). As a result, the first inner sidewalls 18a and an upper surface of the first gate electrode 14a are exposed in the first pMIS region, and the first insulating film 18 is exposed in the nMIS region and the second pMIS region.

In this case, because the first offset spacer 16a is made of a silicon nitride film, an upper portion of the first offset spacer 16a is removed.

In this case, upper surfaces of the second and third protective insulating films 15b and 15c (silicon nitride film) and upper ends of the second and third offset spacers 16b and 16c (silicon nitride film) are covered by the first insulating film 18 (silicon oxide film). Therefore, the second and third protective insulating films 15b and 15c and the second and third offset spacers 16b and 16c are not removed.

In this case, in the step of FIG. 1C, if the thickness T19a of the protective sidewall 19a is the same as the thickness T19 of the second insulating film 19, as shown in FIG. 2C the thickness T18a of the first inner sidewall 18a is the same as the thickness T18 of the first insulating film 18. Note that, in the step of FIG. 1C, if the thickness T19a of the protective sidewall 19a is smaller than the thickness T19 of the second insulating film 19, the first inner sidewall 18a is subjected to etching during a period of time from when the protective sidewall 19a having the smaller thickness T19a is removed to when the second insulating film 19 having the larger thickness T19 is removed. Therefore, the thickness T18a of the first inner sidewall 18a is smaller than the thickness T18 of the first insulating film 18.

In this case, because the first inner sidewall 18a is made of a silicon oxide film, a height of an upper end of the first inner sidewall 18a is higher than a height of an upper surface of the first gate electrode 14a, and therefore, an upper end portion of the first inner sidewall 18a protrudes from the upper surface of the first gate electrode 14a.

Figure 3A:
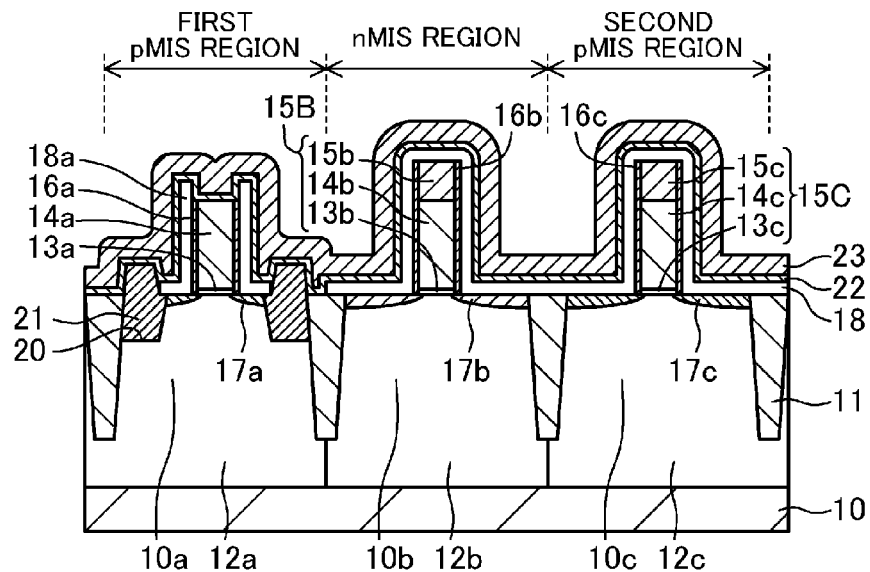
FIGS. 3A-3C are cross-sectional views showing the semiconductor device of the embodiment of the present disclosure as viewed in the gate length direction, in the order in which the semiconductor device is fabricated.

Next, as shown in FIG. 3A, a third insulating film 22 made of, for example, a silicon oxide film having a thickness of 4 nm is deposited on an entire surface of the semiconductor substrate 10 by, for example, a CVD process. Thereafter, a fourth insulating film 23 made of, for example, a silicon nitride film having a thickness of 15 nm is deposited on the third insulating film 22 by, for example, a CVD process.

Figure 3B:
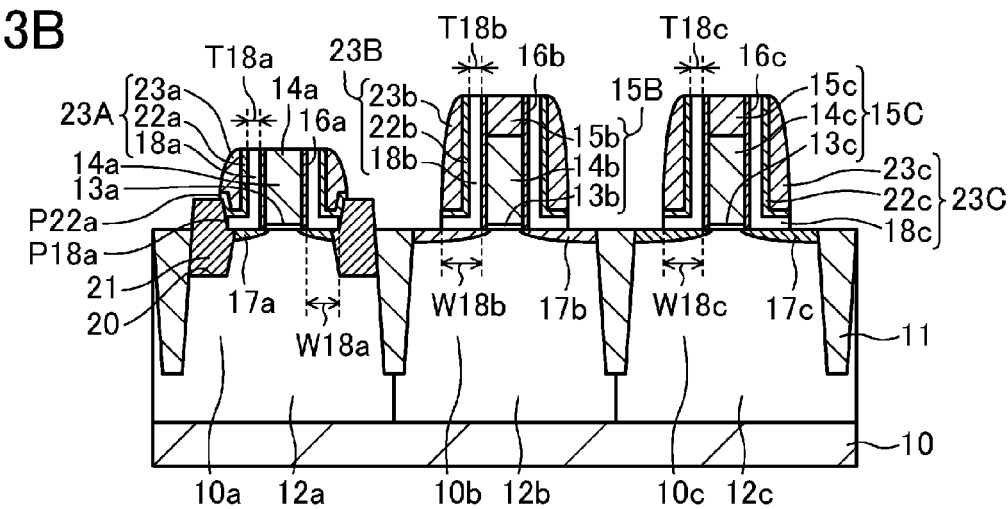

Next, as shown in FIG. 3B, the fourth insulating film 23, the third insulating film 22, and the first inner sidewall 18a in the first pMIS region are successively subjected to anisotropic dry etching, and the fourth insulating film 23, the third insulating film 22, and the first insulating film 18 in the nMIS region and the second pMIS region are successively subjected to anisotropic dry etching. As a result, first sidewalls 23A are formed which include: the first inner sidewall 18a; a first middle sidewall 22a which is made of the third insulating film formed on the first inner sidewall 18a and whose cross-section has an L-shape; and a first outer sidewall 23a made of the fourth insulating film formed on the first middle sidewall 22a. Second and third sidewalls 23B and 23C are formed which include: the second and third inner sidewalls 18b and 18c which are made of the first insulating film formed on side surfaces of the second and third gate electrode formation portions 15B and 15C and whose cross-sections have an L-shape; second and third middle sidewalls 22b and 22c which are made of the third insulating film formed on the second and third inner sidewalls 18b and 18c and whose cross-sections have an L-shape; and second and third outer sidewalls 23b and 23c which are made of the fourth insulating film formed on the second and third middle sidewalls 22b and 22c.

In this case, the width W18a of the first inner sidewall 18a is the same as the width W18a (20 nm) of FIG. 1C. Note that, after having been formed, the first inner sidewall is subjected to various etching processes (e.g., etching for forming the trench 20 as shown in FIG. 2A, or etching for removing the protective sidewall 19a as shown in FIG. 2C, etc.). Therefore, the width W18a of FIG. 3B may be narrower than the width W18a of FIG. 1C.

In this case, the widths W18b and 18c (largest widths) of the second and third inner sidewalls 18b and 18c are 24 nm (the sum of a thickness (5 nm) of the first insulating film 18, a thickness (4 nm) of the third insulating film 22, and a thickness (15 nm) of the fourth insulating film 23). Therefore, the widths W18b and W18c of the second and third inner sidewalls 18b and 18c are larger than the width W18a of the first inner sidewall 18a. By adjusting the thicknesses of the first insulating film 18, the third insulating film 22, and the fourth insulating film 23, the widths W18b and W18c of the second and third inner sidewalls 18b and 18c can be adjusted.

In this case, in the step of FIG. 2C, if the thickness T18a of the first inner sidewall 18a is the same as the thickness T18 of the first insulating film 18, as shown in FIG. 3B the thickness T18a of the first inner sidewall 18a is the same as the thicknesses T18b and T18c of the second and third inner sidewalls 18b and 18c. Note that, in the step of FIG. 2C, if the thickness T18a of the first inner sidewall 18a is smaller than the thickness T18 of the first insulating film 18, the thickness T18a of the first inner sidewall 18a is smaller than the thicknesses T18b and T18c of the second and third inner sidewalls 18b and 18c. Therefore, the thickness T18a of the first inner sidewall 18a is the same as or smaller than the thicknesses T18b and T18c of the second and third inner sidewalls 18b and 18c. As used herein, the term "thickness" in relation to an inner sidewall having a first portion extending in a direction perpendicular to the main surface of the semiconductor substrate and a second portion extending in a direction parallel to the main surface of the semiconductor substrate, refers to a thickness (a thickness in a direction parallel to the main surface of the semiconductor substrate) of the first portion.

In this case, a lower tip P22a of the first middle sidewall 22a is located further away from the first gate electrode 14a than a lower tip P18a of the first inner sidewall 18a. In other words, a distance between the lower tip P22a and the first gate electrode 14a is greater than a distance between the lower tip P18a and the first gate electrode 14a. As used herein, the term "lower tip" in relation to a middle (inner) sidewall having a first portion extending in a direction perpendicular to the main surface of the semiconductor substrate and a second portion extending in a direction parallel to the main surface of the semiconductor substrate, refers to a tip of the second portion.

In this case, the first gate electrode 14a is subjected to etching during a period of time from when the fourth and third insulating films 23 and 22 on the first gate electrode 14a, and the fourth and third insulating films 23 and 22 on the second and third gate electrode formation portions 15B and 15C, are removed to when the first insulating film 18 on the second and third gate electrode formation portions 15B and 15C is removed. Therefore, a height of an upper surface of the first gate electrode 14a is lower than heights of upper surfaces of the second and third gate electrodes 14b and 14c. As used herein, the term "height" in relation to an upper surface of a gate electrode refers to a height from a surface of the active region to the upper surface of the gate electrode.

In this case, a height of an upper end of the first offset spacer 16a is lower than heights of upper ends of the second and third offset spacers 16b and 16c. In this case, a height of an upper end of the first inner sidewall 18a is lower than heights of upper ends of the second and third inner sidewalls 18b and 18c. In this case, a height of an upper end of the first middle sidewall 22a is lower than heights of upper ends of the second and third middle sidewalls 22b and 22c. As used herein, the term "upper end (upper tip)" in relation to a middle (inner) sidewall refers to a tip of the first portion of the middle (inner) sidewall. As used herein, the term "height" in relation to an upper end of an offset spacer (an inner sidewall, a middle sidewall) refers to a height from a surface of the active region to the upper end of the offset spacer (the inner sidewall, the middle sidewall).

Figure 3C:
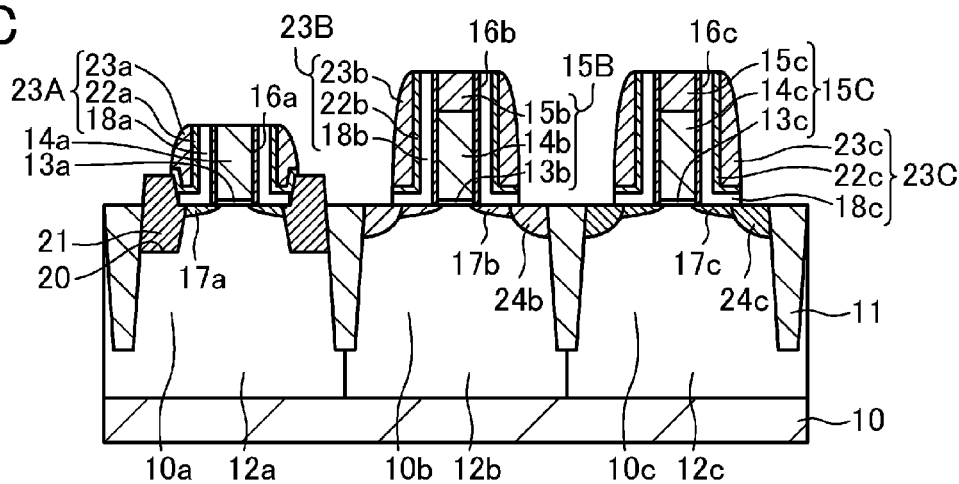

Next, as shown in FIG. 3C, an n-type impurity, such as As etc., is implanted into the second active region 10b by an ion implantation process using the second gate electrode formation portion 15B and the second sidewalls 23B as a mask. As a result, n-type source/drain implanted regions 24b are formed in a self-aligning manner in the second active region 10b laterally outside the second sidewalls 23B. On the other hand, a p-type impurity, such as B etc., is implanted into the third active region 10c by an ion implantation process using the third gate electrode formation portion 15C and the third sidewalls 23C as a mask. As a result, p-type source/drain implanted regions 24c are formed in a self-aligning manner in the third active region 10c laterally outside the third sidewalls 23C.

Figure 4A:
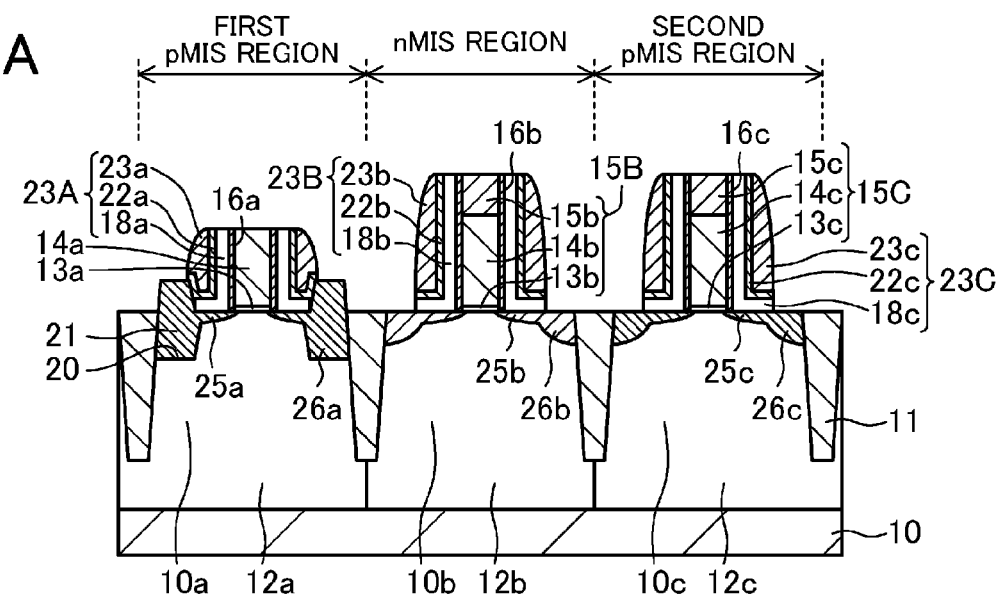
FIGS. 4A-4C are cross-sectional views showing the semiconductor device of the embodiment of the present disclosure as viewed in the gate length direction, in the order in which the semiconductor device is fabricated.

Next, as shown in FIG. 4A, a thermal treatment is performed for one sec at 950° C., for example.

By the thermal treatment, the p-type impurity contained in the first p-type extension injection regions 17a, the n-type impurity contained in the n-type extension injection regions 17b, and the p-type impurity contained in the second p-type extension injection regions 17c are activated. As a result, first p-type extension regions 25a are formed in the first active region 10a in which the silicon compound layer 21 has been formed, laterally outside the first gate electrode 14a. N-type extension regions 25b are formed in the second active region 10b laterally outside the second gate electrode formation portion 15B. Second p-type extension regions 25c are formed in the third active region 10c laterally outside the third gate electrode formation portion 15C.

By the thermal treatment, the p-type impurity contained in the regions (p-type impurity-introduced regions) of the silicon compound layer 21, the n-type impurity contained in the n-type source/drain implanted regions 24b, and the p-type impurity contained in the p-type source/drain implanted regions 24c are activated. As a result, first p-type source/drain regions 26a are formed in the first active region 10a in which the silicon compound layer 21 has been formed, laterally outside the first sidewalls 23A. N-type source/drain regions 26b are formed in the second active region 10b laterally outside the second sidewalls 23B. Second p-type source/drain regions 26c are formed in the third active region 10c laterally outside the third sidewalls 23C.

As described above, by adjusting thicknesses of the first, third, and fourth insulating films 18, 22, and 23, the widths W18b and W18c of the second and third inner sidewalls 18b and 18c can be adjusted. Therefore, by adjusting the width W18b of the second inner sidewall 18b to be wide (e.g., wider than the width W18a of the first inner sidewall 18a), as shown in FIG. 3C the n-type source/drain implanted regions 24b can be formed in the second active region 10b further away from the channel region, and as shown in FIG. 4A the n-type source/drain regions 26b can be formed in the second active region 10b further away from the channel region. Similarly, by adjusting the width W18c of the third inner sidewall 18c to be wide (e.g., wider than the width W18a of the first inner sidewall 18a), as shown in FIG. 3C the p-type source/drain implanted regions 24c can be formed in the third active region 10c further away from the channel region, and as shown in FIG. 4A the second p-type source/drain regions 26c can be formed in the third active region 10c further away from the channel region.

Figure 4B:
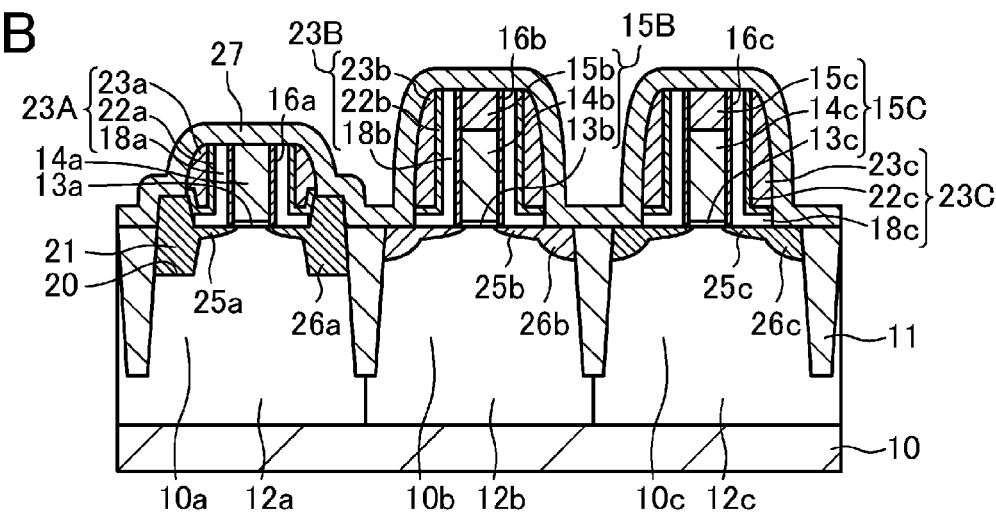

Next, as shown in FIG. 4B, a protective film 27 made of, for example, a silicon oxide film having a thickness of 16 nm is deposited on an entire surface of the semiconductor substrate 10 by, for example, a CVD process.

Figure 4C:
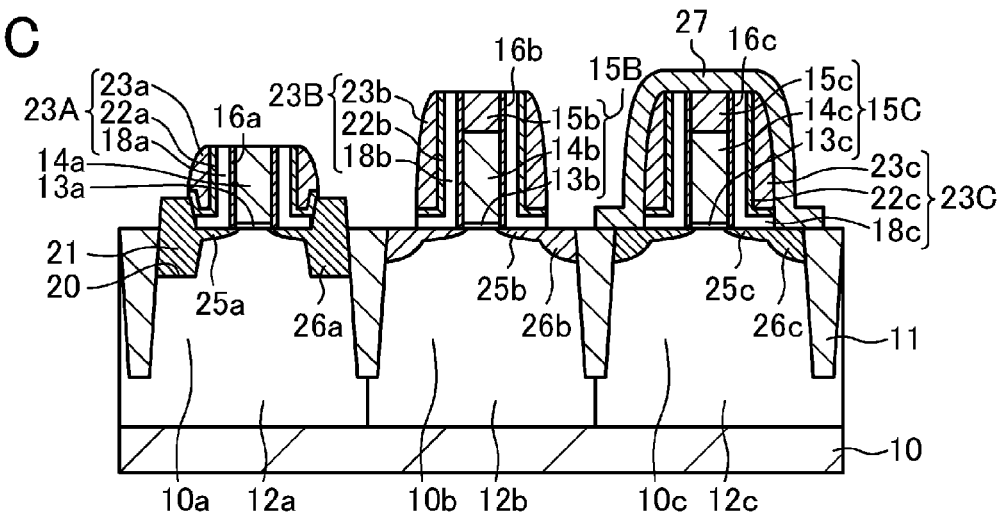

Next, as shown in FIG. 4C, a resist pattern (not shown) which exposes the first pMIS region and the nMIS region and covers the second pMIS region is formed on the protective film 27 by a lithography process. Thereafter, a portion of the protective film 27 which has been formed in the first pMIS region and the nMIS region is removed by an etching process using the resist pattern as a mask. Thereafter, the resist pattern is removed.

Figure 5A:
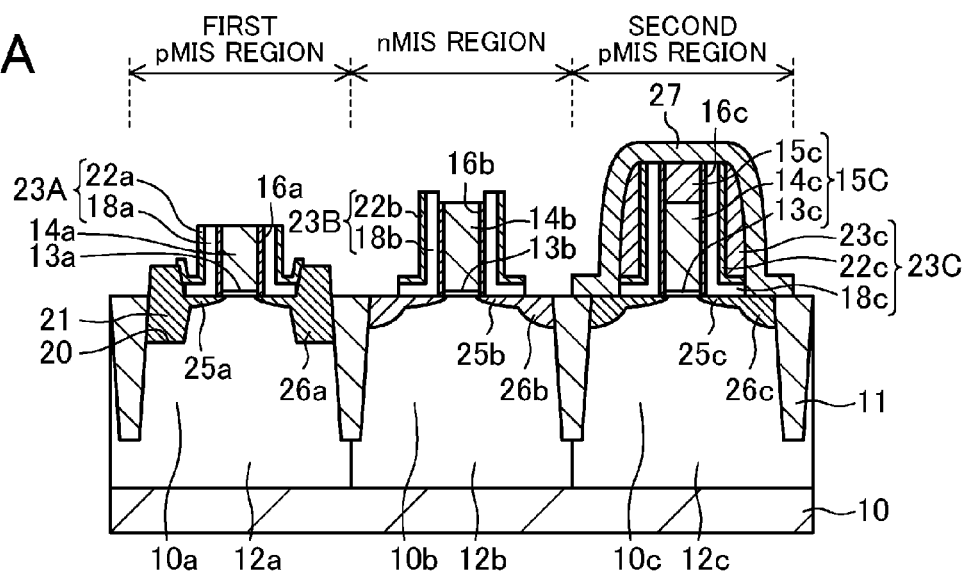
FIGS. 5A-5C are cross-sectional views showing the semiconductor device of the embodiment of the present disclosure as viewed in the gate length direction, in the order in which the semiconductor device is fabricated.

Next, as shown in FIG. 5A, the first outer sidewall 23a (silicon nitride film), the second outer sidewall 23b (silicon nitride film), and the second protective insulating film 15b (silicon nitride film) are removed by an etching process (e.g., a wet etching process using hot phosphoric acid of 160° C. as an etchant) having selectivity to a silicon oxide film (the first and second middle sidewalls 22a and 22b) using the protective film 27 as a mask. As a result, the first middle sidewall 22a is exposed in the first pMIS region, and the second middle sidewall 22b and an upper surface of the second gate electrode 14b are exposed in the nMIS region.

In this case, because the second offset spacer 16b is made of a silicon nitride film, an upper end portion of the second offset spacer 16b is removed.

In this case, because a side surface of the third outer sidewall 23c (silicon nitride film), an upper end of the third offset spacer 16c (silicon nitride film), and an upper surface of the third protective insulating film 15c (silicon nitride film) are covered by the protective film 27, the third outer sidewall 23c, the third offset spacer 16c, and the third protective insulating film 15c are not removed.

In this case, the first gate electrode 14a is subjected to etching until the first and second outer sidewalls 23a and 23b and the second protective insulating film 15b are removed. Therefore, a height of an upper surface of the first gate electrode 14a is lower than heights of upper surfaces of the second and third gate electrodes 14b and 14c.

In this case, because the second inner and second middle sidewalls 18b and 22b are made of a silicon oxide film, heights of upper ends of the second inner and second middle sidewalls 18b and 22b are higher than a height of an upper surface of the second gate electrode 14b, and therefore, upper end portions of the second inner and second middle sidewalls 18*b* and 22*b* protrude from the upper surface of the second gate electrode 14*b*.

In this case, a height of an upper end of the first offset spacer 16*a* is lower than heights of upper ends of the second and third offset spacers 16*b* and 16*c*. In this case, a height of an upper end of the first inner sidewall 18*a* is lower than heights of upper ends of the second and third inner sidewalls 18*b* and 18*c*. In this case, a height of an upper end of the first middle sidewall 22*a* is lower than heights of upper ends of the second and third middle sidewalls 22*b* and 22*c*.

Figure 5B:
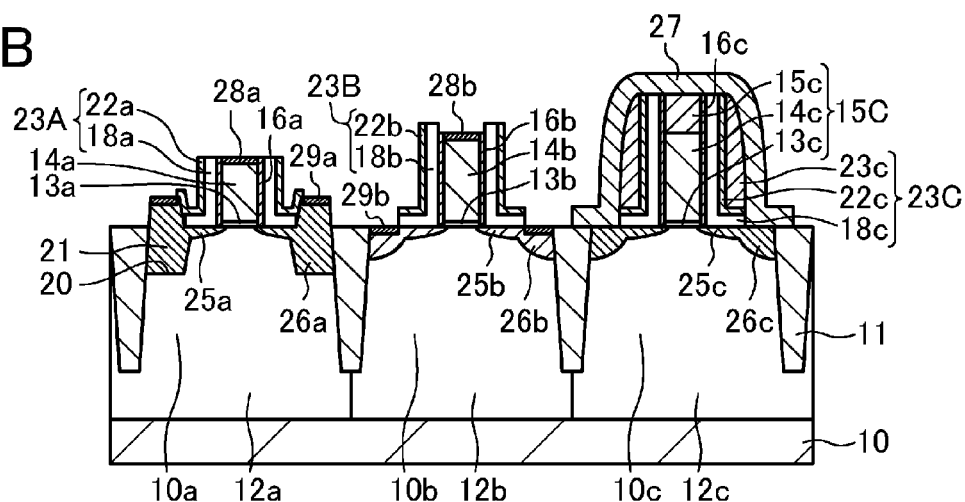

Next, as shown in FIG. 5B, a silicidation metal film (not shown) made of, for example, nickel (Ni) having a thickness of 10 nm is deposited on an entire surface of the semiconductor substrate 10 by a sputtering process. Thereafter, by a thermal treatment, Si contained in the first gate electrode 14*a*, the second gate electrode 14*b*, the first p-type source/drain region 26*a*, and the n-type source/drain region 26*b* and Ni contained in the silicidation metal film are caused to react with each other. As a result, a first silicide layer 28*a* made of nickel silicide having a thickness of 15 nm is formed on the first gate electrode 14*a*. A second silicide layer 28*b* made of nickel silicide having a thickness of 15 nm is formed on the second gate electrode 14*b*. A third silicide layer 29*a* made of nickel silicide having a thickness of 15 nm is formed on the first p-type source/drain region 26*a*. A fourth silicide layer 29*b* made of nickel silicide having a thickness of 15 nm is formed on the n-type source/drain region 26*b*. Note that the third silicide layer 29*a* may contain germanium (Ge) contained in the silicon compound layer 21.

In this case, because a surface of the second p-type source/drain region 26*c* is covered by the protective film 27, a silicide layer is not formed on the second p-type source/drain region 26*c*.

In this case, because the third protective insulating film 15*c* and the protective film 27 are successively formed to cover an upper surface of the third gate electrode 14*c*, a silicide layer is not formed on the third gate electrode 14*c*.

Thereafter, by immersion in an etchant, a portion of the silicidation metal film left on the isolation region 11, the first and second sidewalls 23A and 23B, and the protective film 27, etc. (i.e., an unreacted portion of the silicidation metal film) is removed. Thereafter, by a thermal treatment, the silicide composition ratio of the first, second, third, and fourth silicide layers 28*a*, 28*b*, 29*a*, and 29*b* is stabilized.

In this case, as shown in FIG. 5A, a height of an upper surface of the first gate electrode 14*a* before the silicidation is lower than a height of an upper surface of the second gate electrode 14*b* before the silicidation. Therefore, as shown in FIG. 5B, a height of an upper surface of the first silicide layer 28*a* is lower than a height of an upper surface of the second silicide layer 28*b*. As used herein, the term "height" in relation to an upper surface of a silicide layer refers to a height from a surface of the active region to the upper surface of the silicide layer.

Figure 5C:
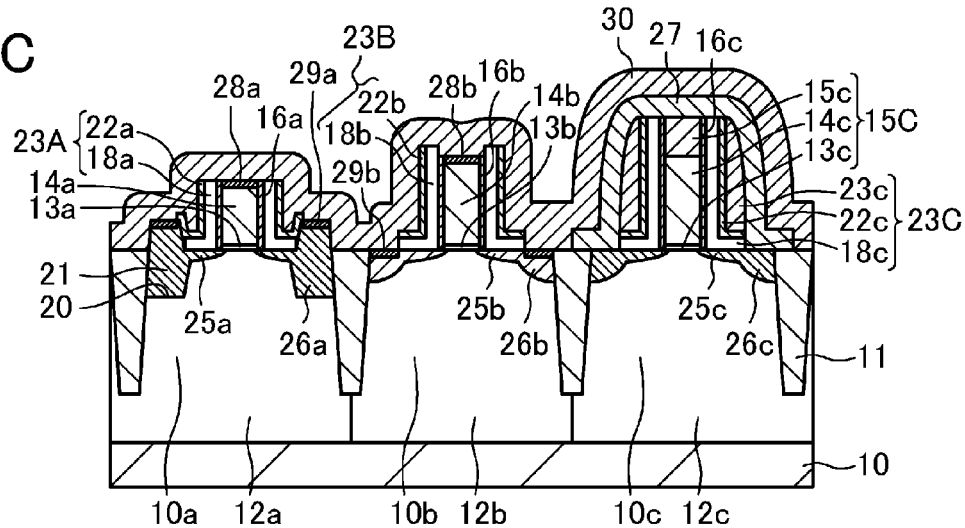

Next, as shown in FIG. 5C, an insulating film 30 made of, for example, a silicon nitride film is deposited on an entire surface of the semiconductor substrate 10 by, for example, a CVD process. Thereafter, although not shown, an interlayer insulating film is formed on the insulating film 30, and thereafter, a contact plug is formed in the insulating film 30 and the interlayer insulating film. Thereafter, an interconnect connected to the contact plug is formed on the interlayer insulating film.

Thus, the semiconductor device of this embodiment can be fabricated.

The fabrication method of this embodiment is different from that of the conventional art in the following points.

Figure 8A:
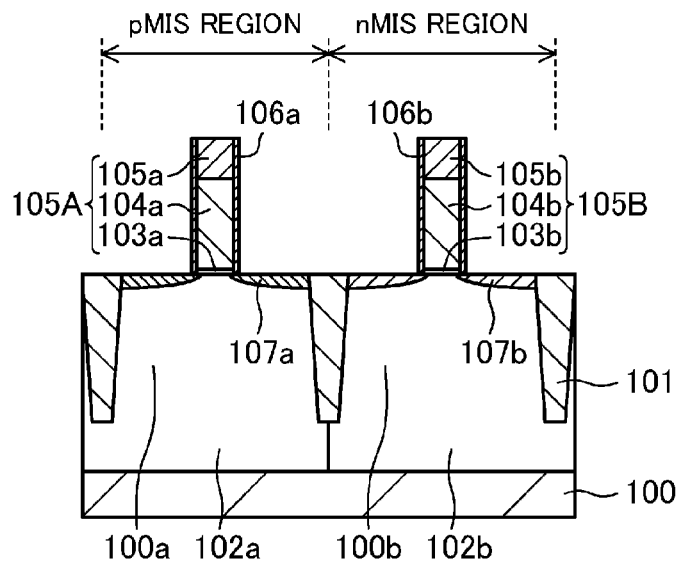
FIGS. 8A-8C are cross-sectional views showing a conventional semiconductor device as viewed in the gate length direction, in the order in which the semiconductor device is fabricated.
Figure 8B:
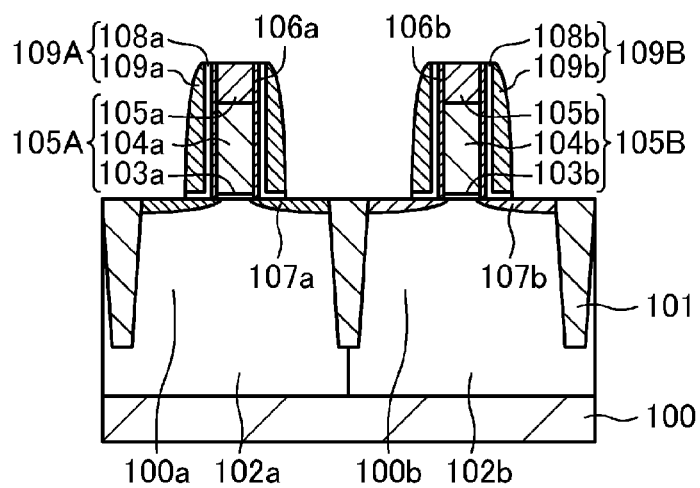
Figure 8C:
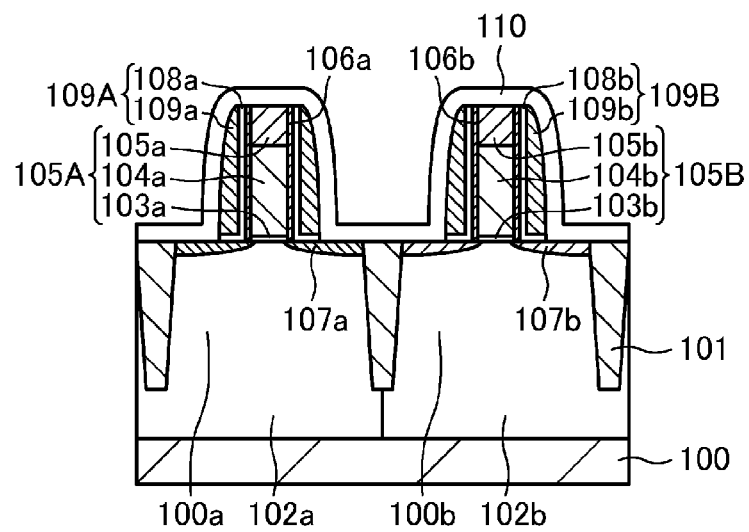
Figure 9A:
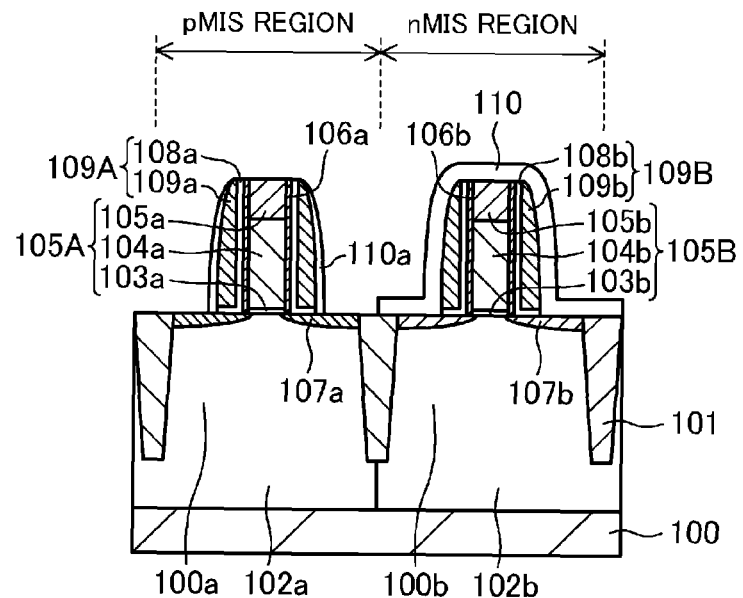
FIGS. 9A-9C are cross-sectional views showing the conventional semiconductor device as viewed in the gate length direction, in the order in which the semiconductor device is fabricated.
Figure 9B:
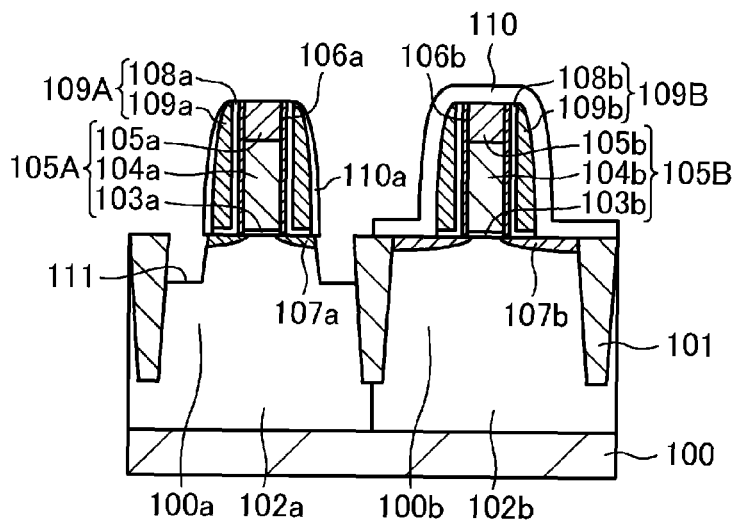
Figure 9C:
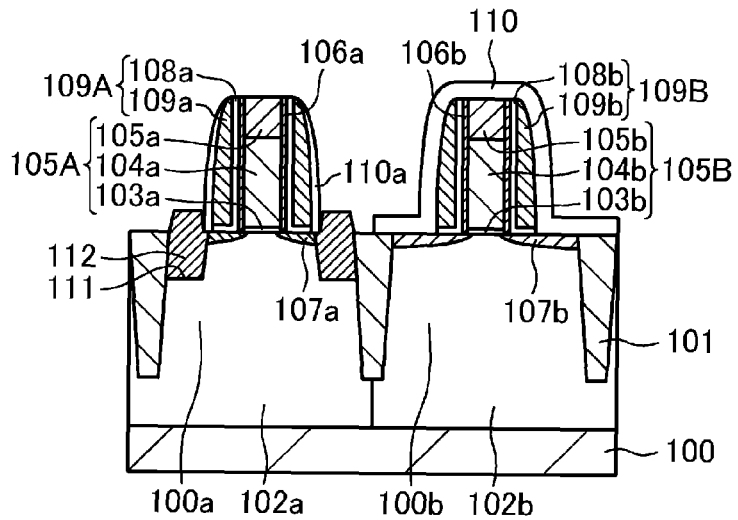
Figure 10A:
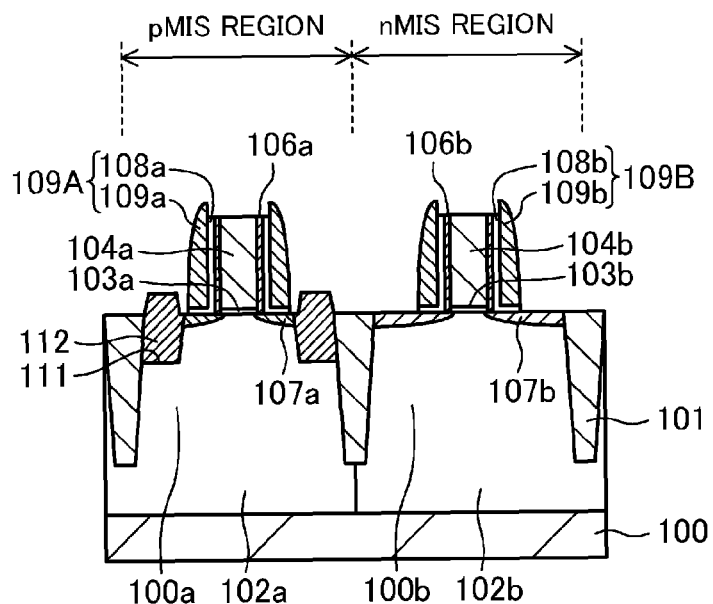
FIGS. 10A-10C are cross-sectional views showing the conventional semiconductor device as viewed in the gate length direction, in the order in which the semiconductor device is fabricated.
Figure 10B:
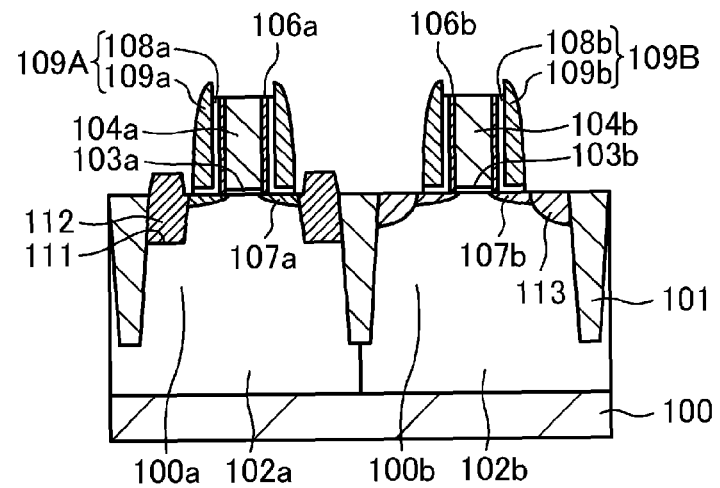
Figure 10C:
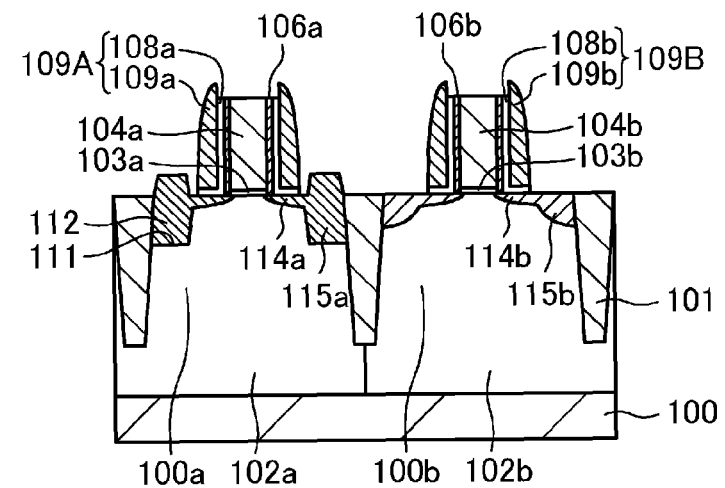

In the conventional art, as shown in FIG. 8B, the first and second sidewalls 109A and 109B are formed. Thereafter, as shown in FIG. 9A, the insulating film 110 (a film for preventing a SiGe layer from being formed in the second active region 100*b*) is formed. In this case, an unnecessary sidewall 110*a* is left on a side surface of the first sidewall 109A. Thereafter, as shown in FIG. 9C, the SiGe layer 112 is formed. Thereafter, as shown in FIG. 10A, the sidewall 110*a* and the insulating film 110 are removed.

In contrast to this, in this embodiment, as shown in FIG. 1C, the first inner sidewall 18*a*, the protective sidewall 19*a*, the first insulating film 18, and the second insulating film 19 (films for preventing a silicon compound layer from being formed in the second, third active regions 10*b* and 10*c*) are formed. Thereafter, as shown in FIG. 2B, the silicon compound layer 21 is formed. Thereafter, as shown in FIG. 2C, the protective sidewall 19*a* and the second insulating film 19 are removed. Thereafter, as shown in FIG. 3B, the first sidewall 23A including the first inner sidewall 18*a*, and the second and third sidewalls 23B and 23C, are formed. In this case, the widths W18*b* and W18*c* of the second and third inner sidewalls 18*b* and 18*c* are larger than the width W18*a* of the first inner sidewall 18*a*.

In the conventional art, after the first and second sidewalls 109A and 109B are formed, the protective film is formed and thereafter the SiGe layer 112 is formed. In contrast to this, in this embodiment, after a portion (the first inner sidewall 18*a*) of the first sidewall 23A and the protective film are formed, the silicon compound layer 21 is formed and thereafter the first, second, and third sidewalls 23A, 23B, and 23C are formed.

A structure of a semiconductor device according to one embodiment of the present disclosure will be described hereinafter with reference to FIG. 6. FIG. 6 is a cross-sectional view showing the structure of the semiconductor device of the embodiment of the present disclosure.

As shown in FIG. 6, the semiconductor device of this embodiment includes a first MIS transistor pTr1 formed in a first pMIS region of a semiconductor substrate 10, a second MIS transistor nTr formed in an nMIS region of the semiconductor substrate 10, and a third MIS transistor pTr2 formed in a second pMIS region of the semiconductor substrate 10. The conductivity type of the first and third MIS transistors is p-type. The conductivity type of the second MIS transistor is n-type.

The first MIS transistor pTr1 includes a first gate insulating film 13*a* formed on a first active region 10*a*, a first gate electrode 14*a* formed on the first gate insulating film 13*a*, first offset spacers 16*a* which are formed on side surfaces of the first gate electrode 14*a* and whose cross-sections have an I-shape, first p-type extension regions 25*a* formed in the first active region 10*a* laterally outside the first gate electrode 14*a*, first sidewalls 23A formed on side surfaces of the first gate electrode 14*a* with the first offset spacers 16*a* being interposed therebetween, first p-type source/drain regions 26*a* formed in the first active region 10*a* laterally outside the first sidewalls 23A, a first silicide layer 28*a* formed on the first gate electrode 14*a*, and a third silicide layer 29*a* formed on the first p-type source/drain regions 26*a*.

The second MIS transistor nTr includes a second gate insulating film 13*b* formed on a second active region 10*b*, a second gate electrode 14*b* on the second gate insulating film 13*b*, second offset spacers 16*b* which are formed on side surfaces of the second gate electrode 14*b* and whose cross-sections have an I-shape, n-type extension regions 25*b* formed in the second active region 10b laterally outside the second gate electrode 14b, second sidewalls 23B formed on side surfaces of the second gate electrode 14b with the second offset spacers 16b being interposed therebetween, n-type source/drain regions 26b formed in the second active region 10b laterally outside the second sidewalls 23B, a second silicide layer 28b formed on the second gate electrode 14b, and a fourth silicide layer 29b formed on the n-type source/drain regions 26b.

The third MIS transistor pTr2 includes a third gate insulating film 13c formed on a third active region 10c, a third gate electrode 14c formed on the third gate insulating film 13c, a third protective insulating film 15c formed on the third gate electrode 14c, third offset spacers 16c which are formed on side surfaces of the third gate electrode 14c and whose cross-sections have an I-shape, second p-type extension regions 25c formed in the third active region 10c laterally outside the third gate electrode 14c, third sidewalls 23C formed on side surfaces of the third gate electrode 14c with the third offset spacers 16c being interposed therebetween, and second p-type source/drain regions 26c formed in the third active region 10c laterally outside the third sidewalls 23C.

The first p-type source/drain region 26a include a silicon compound layer 21 which is formed in trenches 20 provided in the first active region 10a and is used to apply a compressive stress in the gate length direction of the channel region in the first active region 10a.

The first sidewall 23A includes a first inner sidewall 18a whose cross-section has an L-shape, and a first middle sidewall 22a whose cross-section has an L-shape. The second sidewall 23B includes a second inner sidewall 18b whose cross-section has an L-shape, and a second middle sidewall 22b whose cross-section has an L-shape. The third sidewall 23C includes a third inner sidewall 18c whose cross-section has an L-shape, a third middle sidewall 22c whose cross-section has an L-shape, and a third outer sidewall 23c.

A width W18a of the first inner sidewall 18a is smaller than widths W18b and W18c of the second and third inner sidewalls 18b and 18c.

A space between the first gate electrode 14a and the silicon compound layer 21 is smaller than the widths W18b and W18c of the second and third inner sidewalls 18b and 18c.

A height of an upper surface of the first silicide layer 28a is lower than a height of an upper surface of the second silicide layer 28b.

A thickness T18a of the first inner sidewall 18a is the same as or smaller than thicknesses T18b and T18c of the second and third inner sidewalls 18b and 18c.

A lower tip P22a of the first middle sidewall 22a is located further away from the first gate electrode 14a than a lower tip P18a of the first inner sidewall 18a. In other words, a distance between the lower tip P22a and the first gate electrode 14a is greater than a distance between the lower tip P18a and the first gate electrode 14a.

A height of an upper end of the first offset spacer 16a is lower than heights of upper ends of the second and third offset spacers 16b and 16c. A height of an upper end of the first inner sidewall 18a is lower than heights of upper ends of the second and third inner sidewalls 18b and 18c. A height of an upper end of the first middle sidewall 22a is lower than heights of upper ends of the second and third middle sidewalls 22b and 22c.

According to this embodiment, as shown in FIG. 1C, the first inner sidewall 18a having the width W18a (e.g., 20 nm or less) which is smaller than the widths W18b and W18c (see FIG. 3B, for example, 24 nm) of the second and third inner sidewalls 18b and 18c, and the protective sidewall 19a formed on the first inner sidewall 18a, are formed. Thereafter, as shown in FIG. 2A, the trench 20 is formed in the first active region 10a using the protective sidewall 19a as a mask, and thereafter, as shown in FIG. 2B, the silicon compound layer 21 is formed in the trench 20. Therefore, the silicon compound layer 21 can be formed in the first active region 10a closer to the channel region. Therefore, a compressive stress can be effectively applied in the gate length direction of the channel region in the first active region 10a, whereby the drive capability of the first MIS transistor can be effectively enhanced.

In addition, as shown in FIG. 3B, a second sidewall 23B including the second inner sidewall 18b having the width W18b which is larger than the width W18a of the first inner sidewall 18a is formed. Thereafter, as shown in FIG. 3C, the n-type source/drain implanted region 24b is formed in the second active region 10b using the second sidewall 23B as a mask. Thereafter, as shown in FIG. 4A, the n-type impurity contained in the n-type source/drain implanted region 24b is activated to form the n-type source/drain region 26b. Therefore, the n-type source/drain region 26b can be formed in the second active region 10b further away from the channel region, and therefore, an increase in leakage current can be reduced in the second MIS transistor.

Similarly, as shown in FIG. 3B, the third sidewall 23C including the third inner sidewall 18c having the width W18c which is larger than the width W18a of the first inner sidewall 18a is formed. Thereafter, as shown in FIG. 3C, the p-type source/drain implanted region 24c is formed in the third active region 10c using the third sidewall 23C as a mask. Thereafter, as shown in FIG. 4A, the p-type impurity contained in the p-type source/drain implanted region 24c is activated to form the second p-type source/drain region 26c. Therefore, the second p-type source/drain region 26c can be formed in the third active region 10c further away from the channel region, and therefore, an increase in leakage current can be reduced in the third MIS transistor.

Note that, in this embodiment, a specific example has been described in which the first, second, and third gate electrodes 14a, 14b, and 14c made of, for example, a polysilicon film are formed on the first, second, and third gate insulating films 13a, 13b, and 13c made of, for example, a silicon oxide film. The present disclosure is not limited to this. For example, a first, a second, and a third gate electrode including a metal film and a silicon film formed on the metal film may be formed on a first, a second, and a third gate insulating film including an underlying film and a high-k film formed on the underlying film. The underlying film may be made of, for example, a silicon oxide film or a silicon oxynitride film. The high-k film is made of, for example, a hafnium oxide film or a zirconium oxide film having a relative dielectric constant of eight or more. The metal film is made of, for example, titanium nitride (TiN) or tantalum nitride (TaN). The silicon film is made of, for example, a polysilicon film.

In this embodiment, a specific example has been described in which the silicidation metal film made of Ni is used to form the first, second, third, and fourth silicide layers 28a, 28b, 29a, and 29b made of nickel silicide. The present disclosure is not limited to this. For example, the silicidation metal film made of platinum or cobalt instead of Ni may be used to form the first, second, third, and fourth silicide layers made of platinum silicide or cobalt silicide.

<Variation of Embodiment>

A semiconductor device according to a variation of the embodiment of the present disclosure will be described hereinafter with reference to FIG. 7. FIG. 7 is a cross-sectional view showing a structure of the semiconductor device according to the variation of the embodiment of the present disclosure.

A method for fabricating the semiconductor device according to the variation of the embodiment of the present disclosure will be described hereinafter.

Initially, steps similar to those shown in FIGS. 1A-5B are successively performed to obtain a structure similar to that of FIG. 5B.

Next, a first stress insulating film (see what is indicated by a reference character 31 in FIG. 7) which causes a compressive stress in the gate length direction of the channel region in each of a first and a third active region 10a and 10c is formed on an entire surface of a semiconductor substrate 10. Thereafter, a portion of the first stress insulating film which has been formed in an nMIS region is removed.

Next, a second stress insulating film (see what is indicated by a reference character 32 in FIG. 7) which causes a tensile stress in the gate length direction of the channel region in a second active region 10b is formed on an entire surface of the semiconductor substrate 10. Thereafter, a portion of the second stress insulating film which has been formed in a first and a second pMIS region is removed.

Thereafter, an interlayer insulating film (not shown) is formed on the first and second stress insulating films 31 and 32, and thereafter, contact plugs (not shown) are formed in the first and second stress insulating films 31 and 32 and the interlayer insulating film. Thereafter, interconnects (not shown) connected to the contact plugs are formed on the interlayer insulating film.

Thus, the semiconductor device of this variation can be fabricated.

The structure of this variation is different from the structure of the first embodiment in the following points.

In the first embodiment, as shown in FIG. 6, the semiconductor device includes the insulating film 30 formed on an entire surface of the semiconductor substrate 10.

In contrast to this, in this variation, as shown in FIG. 7, the semiconductor device includes the first stress insulating film 31 which causes a compressive stress in the gate length direction of the channel region in each of the first and third active regions 10a and 10c, and the second stress insulating film 32 which causes a tensile stress in the gate length direction of the channel region in the second active region 10b. The first stress insulating film 31 is formed on the first active region 10a to cover the first gate electrode 14a and the first sidewall 23A, and is formed on the third active region 10c to cover the third gate electrode formation portion 15C and the third sidewall 23C with the protective film 27 being interposed between the first stress insulating film 31, and the third gate electrode formation portion 15C and the third sidewall 23C. The second stress insulating film 32 is formed on the second active region 10b to cover the second gate electrode 14b and the second sidewall 23B.

The first and second stress insulating films 31 and 32 are formed to contact surfaces of the first and second middle sidewalls 22a and 22b.

According to this variation, advantages similar to those of the first embodiment can be obtained.

In addition, the first stress insulating film 31 can apply a compressive stress in the gate length direction of the channel region in each of the first and third active regions 10a and 10c, whereby the drive capability of the first and third MIS transistors can be enhanced. Similarly, the second stress insulating film 32 can apply a tensile stress in the gate length direction of the channel region in the second active region 10b, whereby the drive capability of the second MIS transistor can be enhanced.

Moreover, as shown in FIG. 5A, after the first outer sidewall 23a is removed, the first stress insulating film 31 is formed, and therefore, the first stress insulating film 31 can be formed to contact a surface of the first middle sidewall 22a. Therefore, the first stress insulating film 31 can be formed in the first active region 10a closer to the channel region by an amount corresponding to the removed portion of the first outer sidewall 23a, and therefore, the compressive stress can be effectively applied to the channel region in the first active region 10a. Similarly, as shown in FIG. 5A, after the second outer sidewall 23b is removed, the second stress insulating film 32 is formed, and therefore, the second stress insulating film 32 can be formed to contact a surface of the second middle sidewall 22b. Therefore, the second stress insulating film 32 can be formed in the second active region 10b closer to the channel region by an amount corresponding to the removed portion of the second outer sidewall 23b, and therefore, the tensile stress can be effectively applied to the channel region in the second active region 10b.

Moreover, the first stress insulating film 31 can be formed to be thicker by an amount corresponding to the removed portion of the first outer sidewall 23a, and therefore, the compressive stress can be effectively applied to the channel region in the first active region 10a. Similarly, the second stress insulating film 32 can be formed to be thicker by an amount corresponding to the removed portion of the second outer sidewall 23b, and therefore, the tensile stress can be effectively applied to the channel region in the second active region 10b.

As described above, according to the present disclosure, a silicon compound layer can be formed closer to the channel region of a p-type MIS transistor. Therefore, the present disclosure is useful for a semiconductor device including a p-type MIS transistor having p-type source/drain regions including a silicon compound layer, and an n-type MIS transistor, and for a method for fabricating the semiconductor device.

What is claimed is:
1. A semiconductor device comprising:
   a first MIS transistor; and
   a second MIS transistor,
wherein
   the first MIS transistor includes
      a first gate insulating film formed on a first active region in a semiconductor substrate,
      a first gate electrode formed on the first gate insulating film,
      a first silicide layer formed on the first gate electrode,
      first sidewalls each including a first inner sidewall formed on a side surface of the first gate electrode and having an L-shaped cross-section, and
      first source/drain regions of a first conductivity type formed in the first active region laterally outside the first sidewalls,
   the second MIS transistor includes
      a second gate insulating film formed on a second active region in the semiconductor substrate,
      a second gate electrode formed on the second gate insulating film,
      a second silicide layer formed on the second gate electrode,
      second sidewalls each including a second inner sidewall formed on a side surface of the second gate electrode and having an L-shaped cross-section, and second source/drain regions of a second conductivity type formed in the second active region laterally outside the second sidewalls, the first source/drain regions include a silicon compound layer which is formed in trenches provided in the first active region and causes a first stress in a gate length direction of a channel region in the first active region, and a width of the first inner sidewall is smaller than a width of the second inner sidewall.

2. The semiconductor device of claim 1, wherein a space between the first gate electrode and the silicon compound layer is smaller than the width of the second inner sidewall.

3. The semiconductor device of claim 1, wherein a height of an upper surface of the first silicide layer is lower than a height of an upper surface of the second silicide layer.

4. The semiconductor device of claim 1, further comprising:
first offset spacers each formed between the first gate electrode and a corresponding one of the first inner sidewalls and having an I-shaped cross-section; and
second offset spacers each formed between the second gate electrode and a corresponding one of the second inner sidewalls and having an I-shaped cross-section.

5. The semiconductor device of claim 1, wherein a thickness of the first inner sidewall is substantially the same as a thickness of the second inner sidewall.

6. The semiconductor device of claim 1, wherein a thickness of the first inner sidewall is smaller than a thickness of the second inner sidewall.

7. The semiconductor device of claim 1, wherein the first sidewalls each further include a first middle sidewall which is formed on a corresponding one of the first inner sidewalls and has an L-shaped cross-section,
the second sidewalls each further include a second middle sidewall which is formed on a corresponding one of the second inner sidewalls and has an L-shaped cross-section, and
a lower tip of the first middle sidewall is located further away from the first gate electrode than a lower tip of the first inner sidewall.

8. The semiconductor device of claim 1, further comprising:
a first stress insulating film which is formed on the first active region to cover the first gate electrode and the first sidewalls, and causes a stress in the same direction as that of the first stress, in the gate length direction of the channel region in the first active region.

9. The semiconductor device of claim 1, wherein the first MIS transistor is a p-type MIS transistor, and the first stress is a compressive stress.

10. The semiconductor device of claim 1, further comprising:
a second stress insulating film which is formed on the second active region to cover the second gate electrode and the second sidewalls and causes a second stress in a direction opposite to that of the first stress, in a gate length direction of a channel region in the second active region.

11. The semiconductor device of claim 10, wherein the second MIS transistor is an n-type MIS transistor, and the second stress is a tensile stress.

12. The semiconductor device of claim 1, further comprising:
a third MIS transistor including a third gate insulating film formed on a third active region in the semiconductor substrate, a third gate electrode formed on the third gate insulating film, third sidewalls formed on side surfaces of the third gate electrode, and third source/drain regions of the first conductivity type formed in the third active region laterally outside the third sidewalls,
wherein
the third sidewalls include third inner sidewalls formed on the side surfaces of the third gate electrode and having an L-shaped cross-section, third middle sidewalls formed on the third inner sidewalls and having an L-shaped cross-section, and third outer sidewalls formed on the third middle sidewalls,
the first sidewall and the second sidewall do not have an outer sidewall,
a silicon compound layer is not formed in the third source/drain regions, and
a width of the third inner sidewall is larger than the width of the first inner sidewall.

13. The semiconductor device of claim 12, further comprising:
a protective insulating film formed on the third gate electrode,
wherein
a silicide layer is not formed on the third gate electrode.

14. The semiconductor device of claim 1, wherein a height of an upper end of the first inner sidewall is lower than a height of an upper end of the second inner sidewall.

15. The semiconductor device of claim 1, wherein a height of an upper surface of the first gate electrode is lower than a height of an upper surface of the second gate electrode.

* * * * *